United States Patent
Hinks et al.

(10) Patent No.: US 7,420,370 B2
(45) Date of Patent: *Sep. 2, 2008

(54) METHOD AND APPARATUS OF ECHO PLANAR IMAGING WITH REAL-TIME DETERMINATION OF PHASE CORRECTION COEFFICIENTS

(75) Inventors: Richard Scott Hinks, Waukesha, WI (US); Bryan James Mock, Lake Mills, WI (US); Frederick Joseph Frigo, Waukesha, WI (US); Xiaoli Zhao, New Berlin, WI (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/841,542

(22) Filed: Aug. 20, 2007

(65) Prior Publication Data

US 2007/0279055 A1 Dec. 6, 2007

Related U.S. Application Data

(63) Continuation of application No. 11/254,260, filed on Oct. 19, 2005, now Pat. No. 7,259,557.

(51) Int. Cl.
*G01V 3/00* (2006.01)
(52) U.S. Cl. ..................... 324/309; 324/307

(58) Field of Classification Search ............... 324/309, 324/307
See application file for complete search history.

(56) References Cited

U.S. PATENT DOCUMENTS

| 5,151,656 | A | 9/1992 | Maier et al. |
| 5,672,969 | A | 9/1997 | Zhou et al. |
| 6,259,250 | B1 | 7/2001 | Mock |
| 6,466,015 | B2 | 10/2002 | Schaeffter et al. |
| 6,700,374 | B1 | 3/2004 | Wu et al. |
| 6,803,763 | B2 | 10/2004 | Peters et al. |
| 7,019,523 | B2 * | 3/2006 | Ikezaki .................. 324/309 |
| 7,098,662 | B2 | 8/2006 | Hinks et al. |
| 7,102,352 | B2 * | 9/2006 | Hinks et al. ............. 324/318 |
| 7,259,557 | B2 * | 8/2007 | Hinks et al. ............. 324/309 |

OTHER PUBLICATIONS

C.B. Ahn et al., "A New Phase Correction Method in NMR Imaging Based on Autocorrelation and Histogram Analysis," IEEE Transaction on Medical Imaging, Mar. 1987, pp. 32-36, vol. MI-6, No. 1.

(Continued)

*Primary Examiner*—Louis M Arana
(74) *Attorney, Agent, or Firm*—Ziolkowski Patent Solutions Group, SC (57) ABSTRACT

The present invention provides an apparatus and method of phase correction whereby changes in phase characteristics are measured during data acquisition and, accordingly, phase correction parameters that are applied during image reconstruction are updated in real-time. This adaptive and dynamic phase correction reduces variability in image fidelity during the course of long MR scans, such as EPI scans, and provides consistent artifact reduction during the course of an MR scan.

22 Claims, 6 Drawing Sheets

OTHER PUBLICATIONS

S.M. Grieve et al., "Elimination of Nyquist Ghosting Caused by Read-Out to Phase-Encode Gradient Cross-Terms in EPI," Magnetic Resonance in Medicine, 2002, pp. 337-343, No. 47, Wiley-Liss, Inc.

K.P. Pruessmann et al., "SENSE: Sensitivity Encoding for Fast MRI," Magnetic Resonance in Medicine, 1999, pp. 952-962, No. 42, Wiley-Liss, Inc.

D.K. Sodickson et al., "Simultaneous Acquisition of Spatial Harmonics (SMASH): Fast Imaging with Radiofrequency Coil Arrays," MRM, 1997, pp. 591-603, No. 38, Williams & Wilkins.

S. Thesen et al., "Absolute correction of B0 fluctuations in echo-planar imaging," Proc. Intl. Soc. Mag. Reson. Med., 2003, pp. 1025, No. 11.

* cited by examiner

METHOD AND APPARATUS OF ECHO PLANAR IMAGING WITH REAL-TIME DETERMINATION OF PHASE CORRECTION COEFFICIENTS

CROSS REFERENCE TO RELATED APPLICATIONS

The present application is a continuation of and claims priority of U.S. Ser. No. 11/254,260 filed Oct. 19, 2005, now U.S. Pat. No. 7,259,557, the disclosure of which is incorporated herein by reference.

BACKGROUND OF THE INVENTION

The present invention relates generally to magnetic resonance (MR) imaging and, more particularly, to a method and apparatus of determining phase correction coefficients for echo planar imaging (EPI) phase correction and updating those phase correction coefficients in real-time.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Echo Planar Imaging (EPI) is used for many MR imaging applications, including Diffusion Weighted Imaging (DWI), Diffusion Tensor Imaging (DTI), and functional Magnetic Resonance Imaging (fMRI), because of its ability to rapidly acquire diagnostic images. Echo Planar Imaging relies upon bi-polar magnetic gradient fields to acquire MR data. More particularly, EPI is a rapid imaging technique that records an entire image in a repetition interval or TR period. An EPI pulse sequence is generally characterized by a 90° slice selective RF pulse that is applied in conjunction with a slice selection gradient. An initial phase encoding gradient pulse and an initial frequency encoding gradient pulse is used to position spins at a corner of k-space, the matrix that is used to define the relative position of acquired signals along a phase encoding and a frequency encoding direction. A 180° pulse is then applied. Typically, this 180° pulse is not slice selective. The phase and frequency encoding directions are then cycled using phase encoding and readout pulses so as to transverse k-space. In this regard, a frequency encoding gradient follows a phase encoding gradient to record a time signal. Another phase encoding gradient is then applied followed by a reverse polarity frequency gradient during which another time signal is recorded. This cycling continues until k-space is filled. Because k-space can be rapidly traversed in this fashion, images can be acquired at a rate similar to video rates, e.g. 15-30 images per second, or faster.

EPI has been successfully used for a number of clinical applications, and is particularly useful in studies involving the human brain. DWI and DTI are imaging sequences that can be used to obtain useful diagnostic information, e.g. localization of areas damaged by ischemia or hemorrhagic stroke, creation of anisotropic diffusion coefficient (ADC) maps, enhanced anisotropic diffusion coefficient (eADC) maps, and tractography images.

Another important EPI application is FMRI of the brain. Brain fMRI is an imaging technique that relates functional activity occurring in specific locations of the brain to various stimuli, such as speech, motor functions, or visual stimulus. With fMRI it is possible to measure momentary increases in blood flow to specific thought or motor control centers that occur in response to a stimulus. For example, in response to movement of the right index finger, a rapid momentary increase in blood circulation of the specific part of the brain controlling finger movement occurs. Such an increase in blood circulation also yields an increase in oxygen which is paramagnetic and thus affects spin-lattice and spin-spin relaxation times of local brain tissues. These differences in relaxation times manifest themselves as variations in image contrast and can then be exploited with EPI to measure brain function.

Notwithstanding its numerous achievements, a drawback of EPI is that phase errors that lead to image artifacts when not removed from the raw data may be introduced during data acquisition. EPI sequences use a single RF pulse followed by multiple data acquisition windows to encode multiple frames of MR data per RF excitation. While this speeds the rate of data collection, EPI data contains phase errors that result in "Nyquist" ghosting in the phase encoding direction. For a single-shot EPI data collection, Nyquist ghosting manifests itself as an artifact resembling the original image shifted and split in the phase direction.

A number of processes have been developed to correct for these phase errors. Known processes are predicated upon the acquisition of non-phase-encoded reference data, determining phase errors in the reference data, and correcting phase-encoded data based on the phase errors present in the reference data. While these processes have been fruitful in reducing phase errors in EPI, there still remains a need for further improvement in phase error reduction with EPI.

Specifically, it is well-known that data acquisition for EPI scans, such as fMRI and DTI, are often lengthy. As a result, phase characteristics can change during the course of the scan. For example, the gradient coils, which heat during data acquisition, can heat up to levels that change phase characteristics of the data acquired during the scan. In conventional EPI phase corrections, the phase correction coefficients are determined prior to the EPI scan and used regardless of changing phase characteristics that occur during the scan. As a result, image quality deteriorates over time and, specifically, ghosting increases over time.

It would therefore be desirable to have an apparatus and method that accounts for phase characteristic changes, such as those caused by changes in gradient coil thermal characteristics during data acquisition, for phase correction.

BRIEF DESCRIPTION OF THE INVENTION

The present invention provides an apparatus and method of phase correction that overcomes the aforementioned drawbacks. Changes in phase characteristics are measured during data acquisition and, accordingly, phase correction parameters that are applied during image reconstruction are updated in real-time. This adaptive or dynamic phase correction reduces variability in image fidelity during the course of long MR scans, such as EPI scans, and provides consistent artifact reduction during the course of an MR scan.

Therefore, in accordance with one aspect of the invention, an MR imaging apparatus includes a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR imaging apparatus also includes a computer programmed to determine phase correction coefficients from non-phase encoded data acquired in an EPI reference scan. The computer is also programmed to execute an EPI scan to acquire imaging data and, during the EPI scan, acquire non-phase encoded data. The computer then updates the phase correction coefficients from the non-phase encoded data acquired with the EPI scan and applies the updated phase correction coefficients to the imaging data during image reconstruction of the imaging data.

According to another aspect, a method of EPI imaging is disclosed. According to the method, image correction coefficients are determined and EPI images are acquired from a subject. The method also includes the step of determining changes in phase characteristics during the acquisition of the EPI images as well as the step of updating the image correction coefficients based on the changes in phase characteristics.

In accordance with another aspect of the invention, the invention is embodied in a computer program stored on a computer readable storage medium and having instructions which, when executed by a computer, cause the computer to establish phase correction coefficients for an EPI scan and acquire EPI data with the EPI scan. The computer is also caused to update the phase correction coefficients in real-time based on changes in phase characteristics in the EPI data during acquisition of the EPI data. The computer is further caused to apply the updated phase correction coefficients to the EPI data during image reconstruction of the EPI data.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
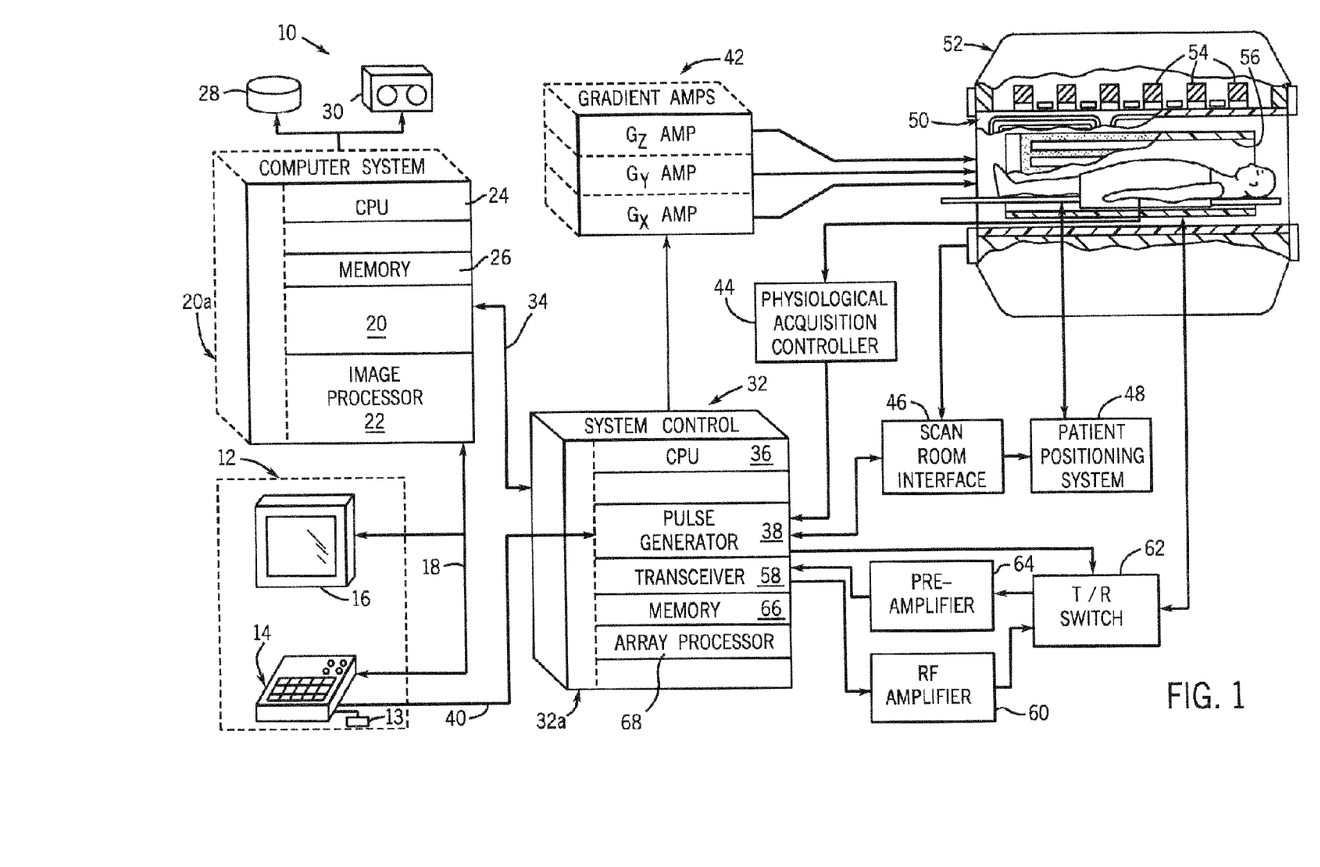
FIG. 1 is a schematic block diagram of an MR imaging system for use with the present invention.

Referring to FIG. 1, the major components of a preferred MR imaging system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to a process of image reconstruction of EPI raw data that may be carried out with the MR imaging system illustrated in FIG. 1, or equivalent thereof. Frames of reference scan data are collected prior to an EPI scan and processed to determine a set of constant and linear phase correction coefficients for each frame of data. The new phase correction coefficients are then used to remove phase errors included with the EPI MR raw data to reduce image artifacts. In a further embodiment the phase correction coefficients are updated in real-time based on reference data acquired during the acquisition of imaging data. Extensive testing with both 1.5T and 3.0T MR systems has shown significant benefit of the present invention. While the invention will be described with respect to steps of a process or method, one skilled in the art will readily appreciate the present invention may be embodied in instructions of a computer program that when executed by a computer carries out the phase error correction processes described herein.

Figure 2:
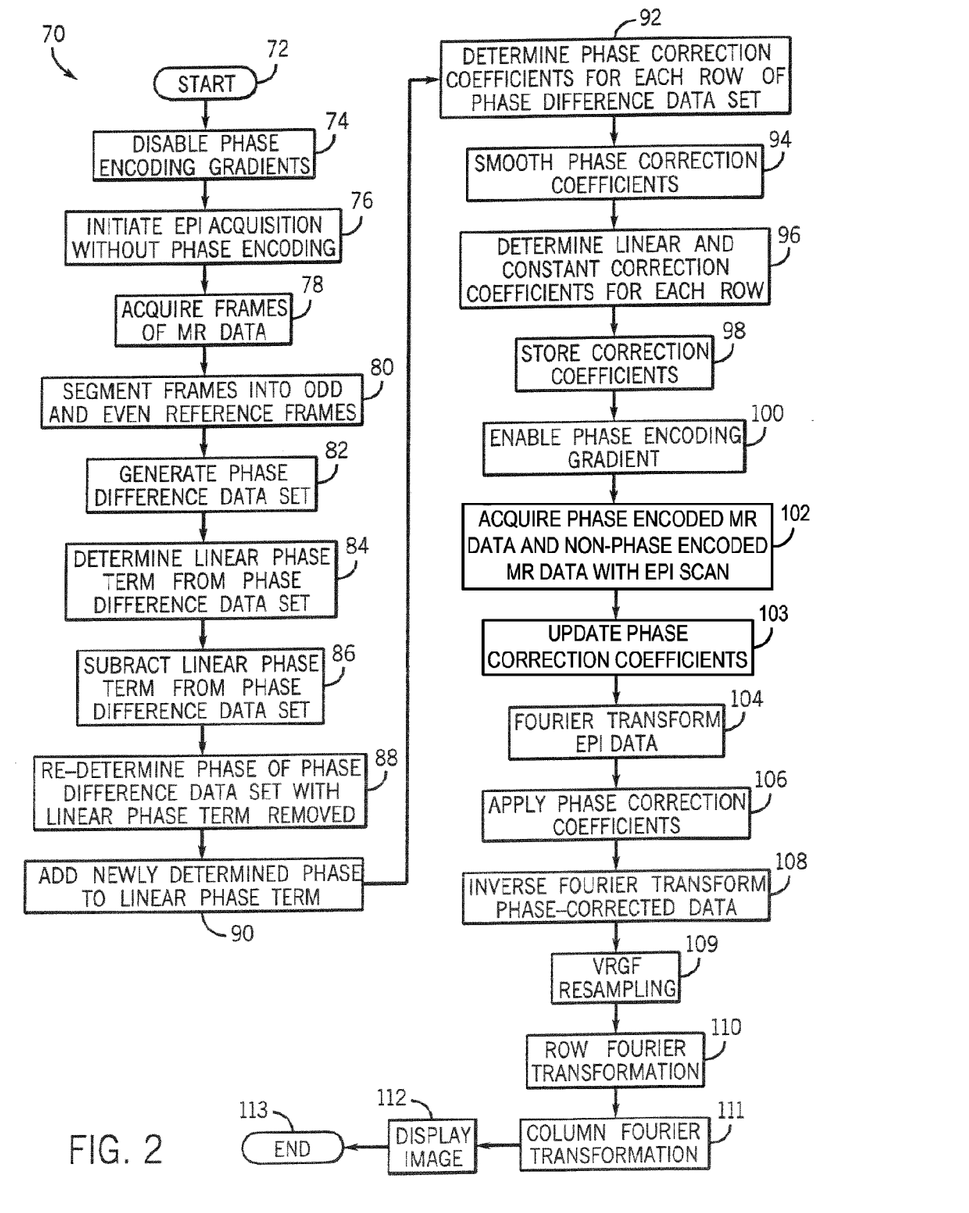
FIG. 2 is a flow chart setting forth the steps an MR data acquisition and phase correction process in accordance with one aspect of the present invention.

Referring now to FIG. 2, the steps of an MR data acquisition process are illustrated. Process 70 is designed to acquire non-phase-encoded MR data, determine phase correction coefficients from the non-phase-encoded or reference MR data, and then apply the phase error correction coefficients to acquired phase-encoded MR data during image reconstruction to reduce image artifacts arising from phase errors. Process 70 is particularly well-suited for EPI scans which typically employ a phase error correction, but may also be applicable with other scan protocols. Additionally, process 70 may be used for single-shot as well as multi-shot MR data acquisitions. The invention is also applicable with single channel and multi-channel data.

Process 70 begins at 72 with the prescription of an EPI scan, such as fMRI acquisition, and positioning of the subject for scanning. Prior to acquiring imaging data, reference data is acquired. This reference data is acquired without phase encoding. As such, the gradient coil assembly responsible for phase encoding is disabled at 74 whereupon the EPI acquisition of non-phase encoding data is initiated at 76. It is contemplated that a number of EPI pulse sequences may be used for the acquisition of the non-phase-encoded reference data. Additionally, it is preferred that the reference data is collected with the same measurement parameters that will used to acquire phase-encoded imaging data.

Consistent with the applied EPI scan, frames or k-space rows of reference data are acquired at 78. The frames are then segmented into odd and even frames 80 corresponding to whether the frames were collected with positive readout gradient polarity (odd) or negative readout gradient polarity (even). In this regard, each frame or row of k-space is designated as either an odd row or an even row. Further, for single-shot EPI, k-space is constructed to have alternating odd and even rows. Once the EPI MR data has been acquired in step 78, frames of MR raw data collected with negative gradient polarity must be time-reversed. In this regard, Variable Readout Gradient Filtering (VRGF) re-sampling is not performed on the non-phase-encoded EPI reference data. Next, the Fourier transform of each row of k-space is performed. After the Fourier transform, the phase of each element in k-space may be computed. A phase difference data set is then generated. For single-shot EPI this is done by subtracting adjacent odd and even rows of MR phase data. For multiple-shot EPI, adjacent frames of MR raw data in k-space acquired with the same gradient polarity are averaged together to form a reduced set of M frames of data from which phase difference data sets will be generated. Specifically, the phase difference dataset is generated at 82 by subtracting the phase of adjacent odd-even frames or rows of k-space. For M frames of data, M−1 rows of phase difference data is generated. Phase subtraction may be implemented by multiplying each frame by the complex conjugate of the next frame as indicated in Eqn. 1:

$$\text{pdiff}_m[n] = r_m[n] * r_{m+1}^*[n] \text{ for } n=0,1,\ldots,N-1 \text{ and } m=0,1,\ldots,M-2 \quad \text{(Eqn. 1)},$$

with the phase difference between adjacent rows defined by:

$$\phi_m[n] = \arctan\left(\frac{\text{Re}(pdiff_m[n])}{\text{Im}(pdiff_m[n])}\right) \text{ for } n = 0, 1, \ldots, N-1 \text{ and } m = 0, 1, \ldots, M-2, \quad \text{(Eqn. 2)}$$

and the magnitude of the nearest neighbor subtraction given by:

$$\rho_m[n] = |pdiff_m[n]| \text{ for } n=0,1,\ldots,N-1 \text{ and } m=0,1,\ldots,M-2 \quad \text{(Eqn. 3)}.$$

From the phase difference dataset, a linear phase term is determined at 84. This linear phase term is computed by summing all real values in the phase difference dataset and all imaginary values in the phase difference dataset, then taking the arctangent to compute the phase, as set forth in Eqn. 4:

$$\phi_{ahn} = \arctan\left(\frac{\text{Re}\left(\sum_{m=0}^{M-2}\sum_{n=0}^{N-2} pdiff_m[n] * pdiff_m^*[n+1]\right)}{\text{Im}\left(\sum_{m=0}^{M-2}\sum_{n=0}^{N-2} pdiff_m[n] * pdiff_m^*[n+1]\right)}\right). \quad \text{(Eqn. 4)}$$

The linear phase term, as determined from Eqn. 4, is then subtracted from the phase difference dataset at 86 as follows. Given:

$$\text{ramp}[n] = n - \frac{N}{2} \text{ for } n = 0, 1, \ldots, N-1, \quad \text{(Eqn. 5)}$$

and $$\phi_{ahn\_row}[n] = \phi_{ahn} * \text{ramp}[n] \text{ for } N = 0, 1, \ldots, N-1, \quad \text{(Eqn. 6)}$$

then the linear phase component can be removed for each row (m) by:

$$\psi_m[n] = \phi_m[n] - \phi_{ahm\_row}[n] \text{ for } n=0,1,\ldots,N-1 \text{ and}$$
$$m=0,1,\ldots,M-2 \tag{Eqn. 7}$$

With the linear phase component removed from each row of the phase difference dataset 86, the phase of the phase difference dataset is then recalculated, or otherwise re-determined, at 88 to perform phase unwrapping. The phase of the phase difference dataset with the removed linear phase component may be defined by:

$$\psi_m[n] = \tan^{-1}\left(\frac{\cos(\psi_m[n])}{\sin(\psi_m[n])}\right) \text{ for } n = 0, 1, \ldots, N-1 \text{ and} \tag{Eqn. 8}$$
$$m = 0, 1, \ldots, M-2.$$

After step 88, the phase will be defined by:

$$-\pi \leq \psi_m[n] \leq \pi \text{ for } n=0,1,\ldots,N-1 \text{ and}$$
$$m=0,1,\ldots,M-2 \tag{Eqn. 9}$$

In a preferred embodiment of the invention, process 90 restores the linear phase component prior to a weighted least-squares fit. In this regard:

$$\psi_m[n] = \psi_m[n] + \phi_{ahm\_row}[n] \text{ for } n=0,1,\ldots,N-1 \text{ and}$$
$$m=0,1,\ldots,M-2 \tag{Eqn. 10}$$

As referenced above, the present invention employs a weighted least-squares fit to provide a first-order characterization of phase errors occurring during EPI reference scan data acquisition in order to remove phase errors in EPI acquired scan data. As such, following step 90, phase correction coefficients for the weighted least-squares fit are determined at 92 for each row or frame of the phase difference dataset. In this regard, a first-order fit is determined by:

$$\psi_m[n] = (a_m * \text{ramp}[n]) + b_m + \epsilon_m \text{ for } n=0,1,\ldots,N-1 \text{ and}$$
$$m=0,1,\ldots,M-2 \tag{Eqn. 11},$$

where $\epsilon_m$ is the error term (minimized using a weighted least squares technique) determined from the unwrapped phase difference, $\psi_m[n]$, as determined from Eqn. 10, and the magnitude of the nearest neighbor subtraction, $\rho_m[n]$, as determined from Eqn. 3.

The phase correction coefficients are interpolated from the results of the weighted least-squares fit of the phase difference data. Given that there are only M-1 rows of phase difference data, the first and the last row of phase difference coefficients are duplicated to form a set of M-1 coefficients. Specifically:

$$\alpha_0 = a_0$$

$$\alpha_{m+1} = a_m \text{ for } m=0,1,\ldots,M-2 \tag{Eqn. 12};$$

$$\alpha_M = a_{M-2}$$

$$\beta_0 = b_0$$

$$\beta_{m+1} = b_m \text{ for } m=0,1,\ldots,M-2 \tag{Eqn. 13}.$$

$$\beta_M = B_{M-2}$$

This set of linear ($\alpha_m$) and constant ($\beta_m$) coefficients can then be smoothed at 94 using one of a number of smoothing functions. In the preferred embodiment, an infinite impulse response (IIR) type filter with quadratic smoothing properties is used; however, other conventional smoothing filters may be used.

Following smoothing of the linear and constant correction coefficients at 94, linear and constant phase correction coefficients are determined for each row of the phase difference dataset at 96. The linear phase correction coefficients for each row are determined by:

$$\text{lin}_m = (-1^m)\frac{\alpha_m + \alpha_{m+1}}{2} \text{ for } m = 0, 1, \ldots, M-1, \tag{Eqn. 14}$$

and the constant phase correction coefficients are determined by:

$$\text{con}_m = (-1^m)\frac{\beta_m + \beta_{m+1}}{2} \text{ for } m = 0, 1, \ldots, M-1. \tag{Eqn. 15}$$

The determined linear and constant phase correction coefficients are then stored in volatile memory and saved to computer storage media to be used to correct phase-encoded EPI data prior to image reconstruction. As will be described, these phase correction coefficients will be updated during the course of the imaging (phase-encoded) scan. It is understood that non-phase encoded and phase-encoded data are required during the imaging scan.

Following determination of the phase correction coefficients, process 70 continues with enablement of the phase encoding gradient coil assembly at 100. In this regard, during EPI imaging data acquisition, phase-encoded MR data is acquired at 102. In addition to the acquisition of phase-encoded data, non-phase encoded reference frames of data are also acquired. As will be described, the reference data will be used to update the phase correction coefficients dynamically. Once the EPI MR data has been acquired in step 102, frames of MR raw data collected with negative gradient polarity must be time-reversed. The phase correction coefficients are then updated at 103. The phase correction coefficients are updated in a manner similar to that used to determine the initial phase correction coefficients heretofore described. Then, phase correction is performed on the data by first performing a Fourier transformation on the data 104. After the Fourier transform 104, phase correction is applied 106 using the updated phase correction coefficients to adjust the phase for each data point in the row in accordance with Eqns. 16-18 below:

$$\chi[n] = (\text{ramp}[n] \cdot \text{lin}_m) + \text{con}_m \text{ for } n=0,1,\ldots,N-1; m=0,$$
$$1,\ldots,M-1 \tag{Eqn. 16},$$

$$\text{phase\_corr}_m[n] = \cos(\chi[n]) + i \sin(\chi[n]) \tag{Eqn. 17, and}$$

$$r_{m\_corrected}[n] = r_m[n] \cdot \text{phase\_corr}[n] \tag{Eqn. 18}.$$

By applying phase correction during image reconstruction, the phase of each data point in the row is adjusted in such a manner as to reduce artifacts in the image resulting from phase errors. Moreover, by updating the phase correction coefficients based on reference data acquired during the EPI scan, changes in phase characteristics, such as those induced by changes in gradient coil thermal characteristics, are considered for phase correction. This phase adjustment is continued for each row of the row transformed data. The phase corrected data (after Eqn. 18) undergoes a subsequent inverse Fourier transformation to return the data to the time domain 108. Then, VRGF re-sampling is performed 109 after phase correction for each row of MR data. Next, each row of MR data is Fourier transformed 110 in the conventional manner. After all rows have been Fourier transformed 110, each column undergoes a Fourier transform 111 whereupon an image is reconstructed and displayed at 112, and process 70 ends at 113.

In addition to the phase error correction technique described with respect to the process of FIG. 2, the present invention is also directed to a VRGF re-sampling technique also designed to improve image quality during EPI reconstruction. VRGF re-sampling is a time domain dependent interpolation process that is carried out to re-sample raw data collected with variable readout gradients (ramp-sampling). VRGF re-sampling typically uses discrete-time convolution to transform data acquired during gradient transitions into uniformly sampled data typical of that acquired during gradient steady-state. Moreover, VRGF re-sampling is conventionally applied before phase correction. As a result, phase errors that are present in the raw, acquired MR data may not be suitable for phase correction. These phase errors are particularly well-pronounced when EPI data is acquired with poorly calibrated MR systems. Notwithstanding the advantages achieved with conventional VRGF re-sampling, performing phase correction before VRGF re-sampling can be error prone, and is generally inefficient if a system is not calibrated sufficiently to provide proper echo alignment between data collected with positive and negative readout gradient polarity. Accordingly, the present invention is also directed to an EPI reconstruction technique whereby phase correction occurs before VRGF re-sampling to make phase correction less sensitive to echo alignment deficiencies that may exist in a poorly calibrated system.

Figure 3:
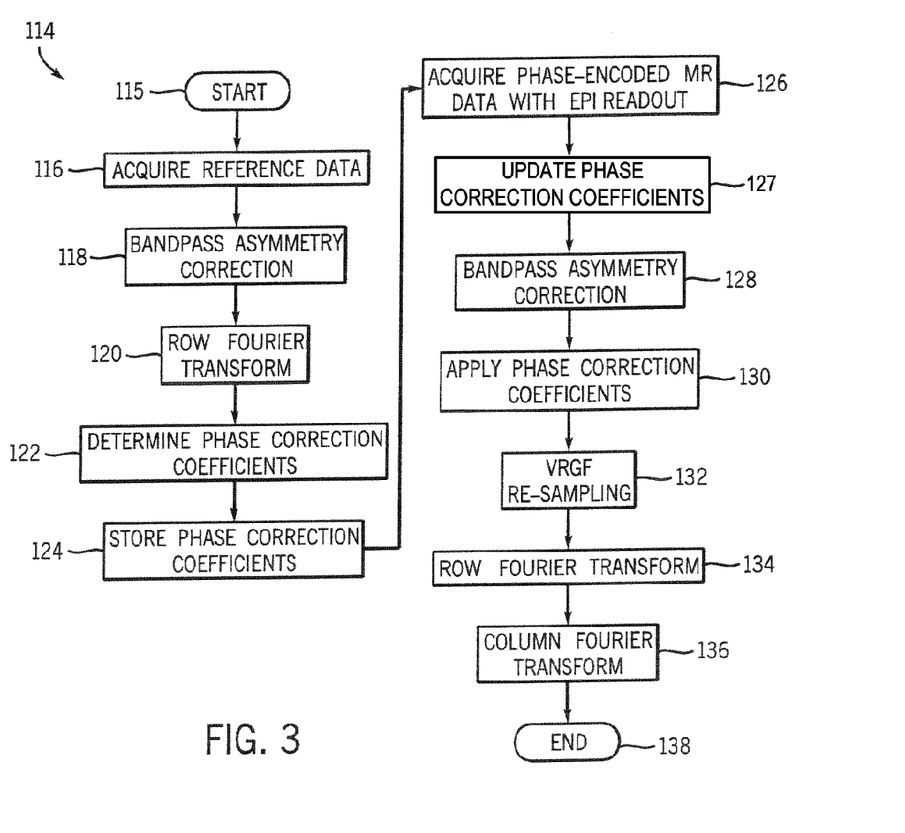
FIG. 3 is a flow chart setting forth the steps of a Variable Readout Gradient Filtering (VRGF) technique in accordance with another aspect of the present invention.

Referring now to FIG. 3, process 114 sets forth the steps of an EPI reconstruction technique in accordance with another embodiment of the invention. Process 114 begins at 115 with the prescription of an EPI scan. Reference, non-phase-encoded MR data is then acquired at 116 in a manner similar to that described with respect to FIG. 2. Bandpass asymmetry correction may then be performed at 118 to correct for the effects of asymmetrical filter response on the MR data. The bandpass asymmetry corrected data is then row Fourier transformed (without re-sampling) 120 and phase correction coefficients are determined, or otherwise calculated, at 122. The phase correction coefficients are preferably determined in accordance with the technique described above with respect to FIG. 2 and Eqns. 1-18. The determined phase correction coefficients are then stored in memory and saved to computer media at 124. The phase correction coefficients will then be updated in real-time during the EPI scan and used for phase correction during EPI reconstruction.

After the phase correction coefficients have been determined and stored, phase-encoded EPI data and reference data is acquired at 126 consistent with the parameters of the MR session defined at 114. The reference data is used to update the phase correction coefficients 127. In this regard, the phase correction coefficients are continuously updated during the scan. As such, changing phase conditions are considered throughout the scan. Similar to the acquired reference data, the EPI data may also be bandpass asymmetry corrected in a conventional manner to correct for asymmetries at 128. The MR raw data is then Fourier transformed and the updated phase correction coefficients are then applied to the data 130. The phase correction coefficients are applied to reduce phase errors that are typically encountered during EPI. Next, the phase corrected data is then inverse Fourier transformed, completing the phase correction step 130.

After the step of phase correction 130, the phase corrected data is subjected to VRGF re-sampling. The phase corrected data is re-sampled using one of a number of known VRGF re-sampling techniques. The re-sampled data is then row and column Fourier transformed at 134 and 136, respectively, to reconstruct an image at 138, whereupon process 112 ends. As described above and in contrast to known EPI reconstruction processes, VRGF re-sampling is carried out after phase correction. In this regard, phase errors in the raw data are reduced prior to re-sampling. This is especially evident for poorly calibrated systems where echo alignment between frames of data collected with positive and negative gradient readout polarity varies significantly.

A drawback of post-phase correction VRGF re-sampling, however, is that the Fourier transform must be performed on a larger dataset. Then, after phase correction, an inverse Fourier transform must be carried out so that the VRGF re-sampling can be performed in the time domain. As a result, the computational requirements of the process can be burdensome. In this regard, the present invention is also directed to an EPI reconstruction technique that performs VRGF before phase correction in a conventional manner, but also reduces phase errors to a degree not feasible with conventional EPI reconstruction techniques.

Figure 4:
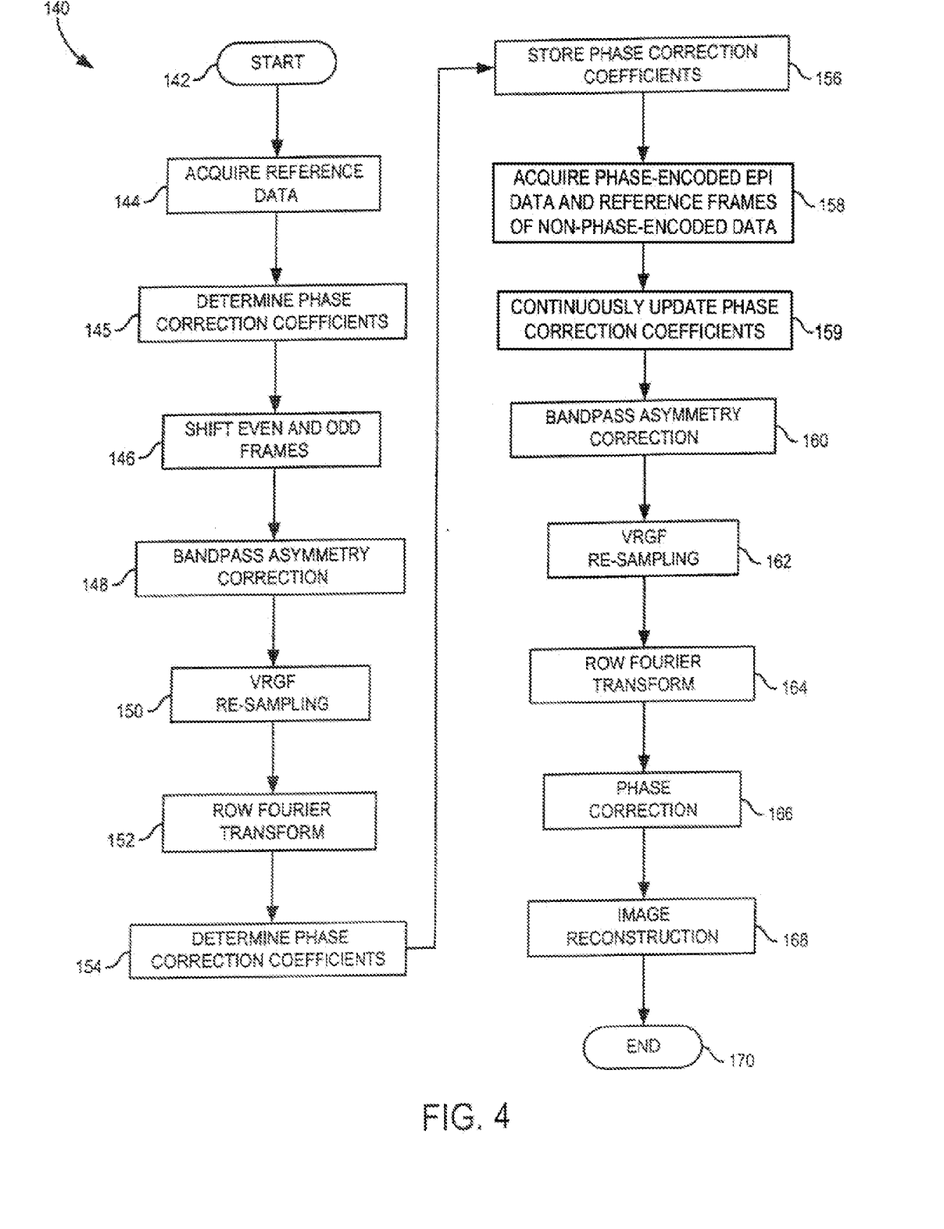
FIG. 4 is a flow chart setting forth the steps of an EPI reconstruction utilizing VRGF re-sampling with shifted/re-aligned reference data in accordance with another aspect of the present invention.

Referring now to FIG. 4, process 140 begins at 142 with the prescription of an EPI scan to acquire MR data from a subject, such as a brain image using fMRI. Prior to the acquisition of imaging data, reference data that lacks phase encoding is acquired at 144. Phase correction coefficients are then determined at 145 in accordance with the phase correction coefficient determination process described with respect to FIG. 2 and Eqns. 1-18 with no VRGF re-sampling applied to the MR data. The phase correction coefficients are then used to determine appropriate shift parameters. Specifically, the linear phase correction coefficients for all views (frames or rows) of data collected with negative polarity gradients are averaged together to yield an average linear phase correction term for negative views, $\gamma_n$. Similarly, the linear phase correction coefficients for all views of data acquired with positive polarity gradients are averaged together to form an average linear phase correction term for positive views, $\gamma_p$. The $\gamma_n$ and $\gamma_p$ parameters are used to determine the appropriate amount of shifting in the time domain to be done on the raw data prior to EPI reconstruction for frames of data collected with negative and positive polarity gradients, respectively. The odd and even frames of reference data are then shifted at 146 based on the $\gamma_n$ and $\gamma_p$ parameters as shown below.

$$\gamma_p \propto \delta_p$$

$$\gamma_n \propto \delta_n$$

where $\{\delta_p, \delta_n\}$ are integers.
For negative gradient readout polarity:

$$k_m[n] = \begin{Bmatrix} k_{negative}[n+\delta_n] \text{ for } 0 \leq n+\delta_n < N \\ 0 \text{ otherwise} \end{Bmatrix} \text{ for } 0 \leq n < N. \quad \text{(Eqn. 19)}$$

For positive gradient readout polarity:

$$k_m[n] = \begin{Bmatrix} k_{positive}[n+\delta_p] \text{ for } 0 \leq n+\delta_p < N \\ 0 \text{ otherwise} \end{Bmatrix} \text{ for } 0 \leq n < N. \quad \text{(Eqn. 20)}$$

Shifting of the even and odd frames eliminates the need to apply phase correction coefficients prior to VRGF re-sampling. It is understood that step 146 allows for faster processing time.

A second pass is then made through the reference data whereupon the shifted data is then bandpass asymmetry corrected at 148 to correct for asymmetries followed by VRGF re-sampling 150. In this regard, VRGF re-sampling takes place prior to phase correction, but is applied to time-shifted or re-aligned raw data. Shifting the data effectively performs crude echo alignment between data frames collected with positive and negative gradient polarity. The re-sampled data is then row Fourier transformed 152 and new phase correction coefficients are determined at 154. Preferably, the new phase correction coefficients are determined in accordance with the steps described with respect to FIG. 2 and Eqns. 1-18. The new phase correction coefficients are then stored in volatile memory and saved to computer storage media at 156 for subsequent use during EPI reconstruction.

Once the new phase correction coefficients have been determined, phase-encoded EPI data as well as reference frames of non-phase encoded data is acquired at 158. The reference frames of non-phase-encoded data is acquired throughout the EPI scan. Accordingly, the phase correction coefficients are updated throughout the EPI scan in real-time 159. The phase-encoded data is then bandpass asymmetry corrected to correct for asymmetries at 160. VRGF re-sampling is then carried out to re-sample data acquired during gradient transitions. The re-sampled data is then row Fourier transformed at 164 followed by application of the updated phase correction coefficients at 166 to correct for phase errors in the phase-encoded EPI data. Following phase correction, an image is reconstructed and displayed (and/or stored) in a conventional manner at 168, whereupon the process ends at 170.

As referenced herein, the present invention is directed to a phase correction technique that acquires non-phase encoded reference data as well as phase encoded imaging data from which images will be generated during an EPI scan. The non-phase encoded reference data acquired during the acquisition of the EPI imaging data is processed to determine changes in phase characteristics during the course of the scan. From these changes in phase characteristics, the phase correction coefficients used during image reconstruction are updated such that changing phase characteristics are considered during image reconstruction. In this regard, the increased ghosting heretofore encountered during long EPI scans is mitigated. For example, increased ghosting has been particularly problematic for EPI scans with high slew rates because of the changes in thermal properties of the gradient coils during the course of the scan. With the present invention, the changes and thermal loads of the gradient coils as manifested in changing phase characteristics during the course of a scan are considered and used to update phase correction coefficients so that factors not present during the acquisitions of the EPI reference data from which the default phase correction coefficients were determined are considered.

Figure 5:
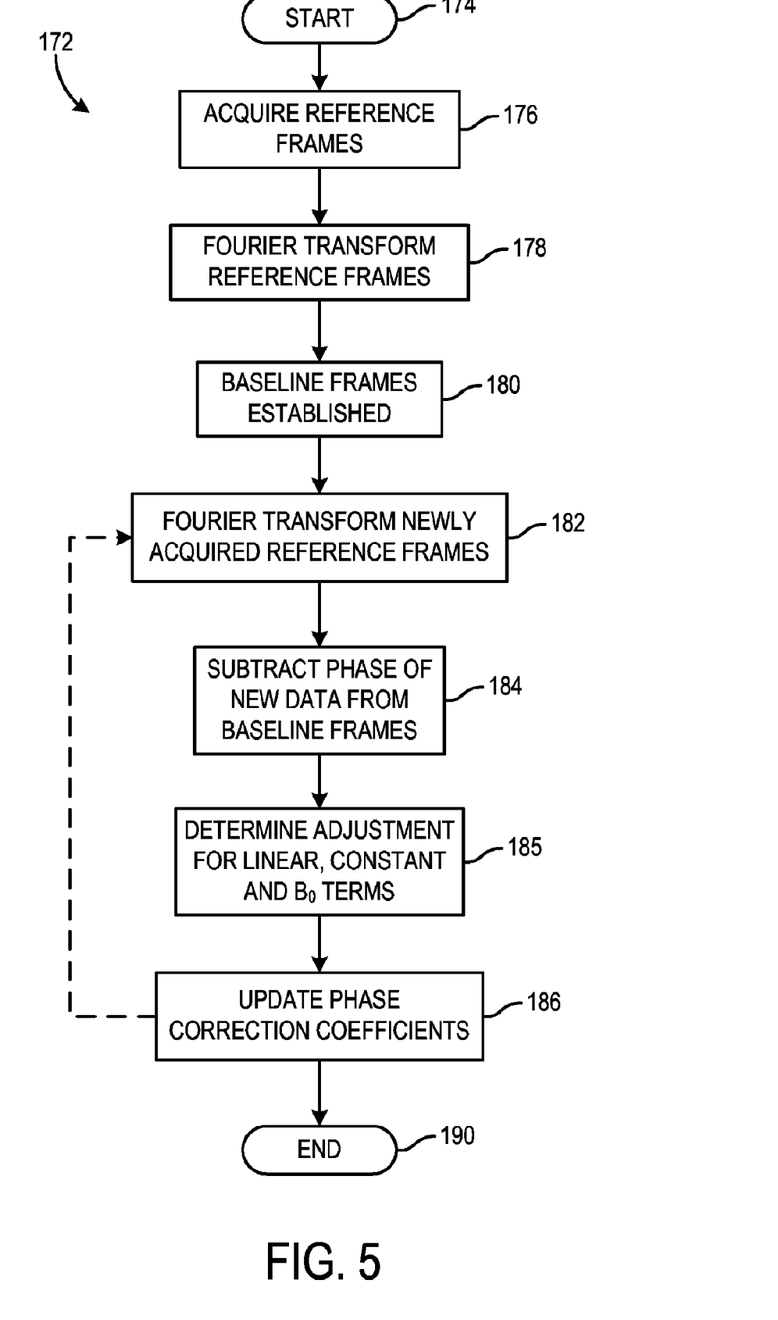
FIG. 5 is a flow chart setting forth the step of dynamically determining phase correction coefficients according to the present invention.

Referring now to FIG. 5, the steps of dynamic phase correction technique according to the present invention are set forth. The technique 172 begins at 174 with execution of the EPI scan that acquires EPI imaging data as well as non-phase encoded reference data. Preferably, the first two passes of dynamic EPI reference data are discarded, since the phase characteristics of these passes may differ from the phase characteristics acquired during steady-state conditions later in the scan.

Input reference data for the next passes (L=3 nominally) is processed in the manner described above. Time-reversal (row-flipping) is performed for data that was collected with negative gradient readout polarity. The reference data is then Fourier transferred at 178. After the data for each reference frame has undergone Fourier transformation 178, it is averaged to establish a set of baseline frames for dynamic EPI phase correction processing 180. Specifically:

$$r_{baseline}[n] = \frac{\sum_{i=1}^{L} r_i[n]}{L} \text{ for } 0 \leq n < N. \quad \text{(Eqn. 21)}$$

After a set of baseline frames for dynamic EPI reference data has been established 180, incoming reference data undergoes Fourier transformation 182. Then, this data is phase subtracted from the baseline reference data 184. Thereafter, adjustments for linear and constant $B_0$ term of phase correction coefficients are determined 185. The EPI phase correction coefficients used during image reconstruction are then updated based on the adjustments 186. This updating of the phase correction coefficient continues until the EPI scan is completed 190.

Phase subtraction may be implemented by multiplying each frame by the complex conjugate of the frame to be subtracted as indicated below:

$$\text{pdiff}_{dynamic}[n] = r_{baseline}[n] * r_{current}^*[n] \quad \text{(Eqn. 22)}.$$

After this, the extra frames of non-phase encoded reference data are processed with the algorithm as described by Eqns. 2-8. This effectively provides a means to compute a linear ($a_k$) and constant ($b_k$) term for each frame (k) of dynamic EPI reference data at time, t. The linear and constant terms obtained from three key frames (k=0,1,2) of reference data during the EPI scan are then used to update the phase correction coefficients used during image reconstruction. As such:

$$b_0\text{phase}(t) = 0.5(b_0 - b_2) \quad \text{(Eqn. 23)};$$

$$\text{pccon}(t) = 0.5(b_0 - b_1 + b_2) \quad \text{(Eqn. 24)}; \text{ and}$$

$$\text{pclin}(t) = 0.5(a_0 - a_1 + a_2) \quad \text{(Eqn. 25)}.$$

A smoothing filter is used to filter dynamic EPI phase correction parameters over time, t. This results in:

$$b_0\text{phase}(t) = (1.0 - \alpha)b_0\text{phase}(t-1) + \alpha b_0\text{phase}(t) \quad \text{(Eqn. 26)};$$

$$\text{pclin}(t) = (1.0 - \alpha)\text{pclin}(t-1) + \alpha\text{pclin}(t) \quad \text{(Eqn. 27)}; \text{ and}$$

$$\text{pccon}(t) = (1.0 - \alpha)\text{pccon}(t-1) + \alpha\text{pccon}(t) \quad \text{(Eqn. 28)},$$

where $\alpha = 0.2$ nominally

Prior to image reconstruction, the phase correction coefficients determined during EPI reference scan $\text{lin}_m(0)$ and $\text{con}_m(0)$, are updated with the dynamic EPI phase correction results as follows:

$$\delta b0_m = m \cdot b_0 phase(t) \text{ for } m = 0, 1, \ldots, M-1; \quad \text{(Eqn. 29)}$$

$$\delta con_m = (-1^m)\frac{pccon(t)}{2} \text{ for } m = 0, 1, \ldots, M-1; \quad \text{(Eqn. 30)}$$

$$\delta lin_m = (-1^m)\frac{pclin(t)}{2} \text{ for } m = 0, 1, \ldots, M-1; \quad \text{(Eqn. 31)}$$

then $$lin_m(t) = lin_m(0) + \delta lin \text{ for } m = 0, 1, \ldots, M-1; \text{ and} \quad \text{(Eqn. 32)}$$

$$con_m(t) = con_m(0) + \delta con_m + \delta b0_m \text{ for } m = 0, 1, \ldots, M-1. \quad \text{(Eqn. 33)}$$

It is contemplated that the above phase correction can be applied to single channel and multi-channel acquisitions. For multiple-channel dynamic EPI phase correction, reference data from each channel is processed independently as described above. Then $b_0$phase, pccon, and pclin from each channel (c) are combined using a magnitude squared weighting scheme, where weights ($w_c$) are determined for each channel:

$$w_c = \sum_{k=0}^{K-1} \sum_{n=0}^{N-1} |r_k[n]|^2 \quad \text{(Eqn. 34)}$$
$$\text{for } n = 0, 1, \ldots, N-1; k = 0, 1, 2;$$

$$b_0\text{phase}(t) = \sum_{c=0}^{C-1} \frac{b_0\text{phase}(t)_c}{w_c}; \quad \text{(Eqn. 35)}$$

$$pccon(t) = \sum_{c=0}^{C-1} \frac{pccon(t)_c}{w_c}; \text{ and} \quad \text{(Eqn. 36)}$$

$$pclin(t) = \sum_{c=0}^{C-1} \frac{pclin_c(t)_c}{w_c}. \quad \text{(Eqn. 37)}$$

After this combination using the magnitude squared weighted averaging scheme, the processing described herein is performed to update the EPI phase correction coefficients used in image reconstruction.

Figure 6:
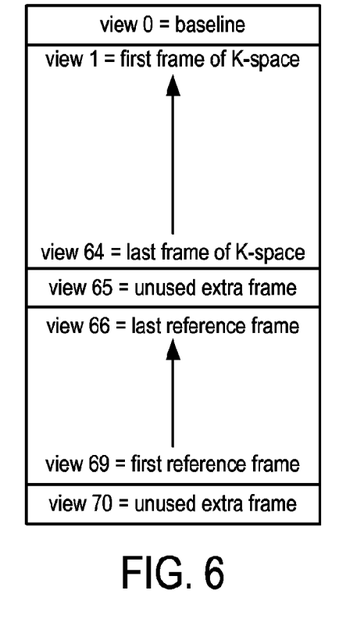
FIG. 6 is a view map illustrating data acquisition order for a bottom up acquisition in accordance with one aspect of the present invention.
Figure 7:
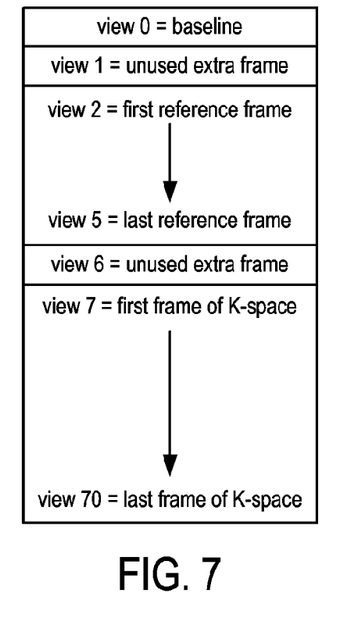
FIG. 7 is a view map illustrating data acquisition order for a top down acquisition in accordance with another aspect of the present invention.

As described above, the phase correction technique of the present invention acquires reference frames of non-phase encoded data actively during an EPI scan wherein phase encoded imaging data is acquired. While a number of acquisition orders are compensated, two exemplary acquisition orders are illustrated in FIGS. 6-7. FIG. 6 illustrates a bottom-up acquisition order wherein reference frames are acquired first, then, the rest of k-space is filled from the bottom up. Specifically, as illustrated, view 0 corresponds to a base line view. The next 64 views correspond to frames of k-space that will be used for image reconstruction. The non-phase-encoded reference data is stored after the phase-encoded data, but collected prior to the phase-encoded data. That is, the first reference frame acquired corresponds to view 69, whereas the last reference frame acquired corresponds to view 66. In the exemplary view acquisition, view 70 corresponds to an unused extra frame. As described above, the reference frame data will be processed to access changing phase characteristics and used to update the phase correction coefficients in real-time such that the changes in phase characteristics during the course of an EPI scan are considered during phase correction.

FIG. 7 corresponds to a top-down acquisition. In this regard, reference frames are acquired before imaging data and stored before the phase-encoded data. Specifically, as illustrated, view 0, as in FIG. 6, corresponds to a base line frame. After an unused extra frame is acknowledged, reference frames are acquired during view 2 through view 5. View 6 corresponds to an unused extra frame followed by the acquisition of 64 frames of K space or imaging data. While the acquisition order is different for the top-down acquisition, like the bottom-up acquisition, the reference frames will be used to dynamically update the phase correction coefficients so that changes in phase characteristics, such as those induced by gradient coil thermal load changes during the course of the EPI scan, are considered during phase correction.

The present invention is applicable to single and multi-channel reconstruction where data from each channel is processed independently and then combined using a sum of the squares technique. The present invention may also be carried out for multi-channel parallel imaging techniques, such as SENSitivity Encoding (SENSE) or Array Spatial and Sensitivity Encoding Technique (ASSET). The present invention is also applicable with EPI scans carried out at several magnetic field strengths, including, but not limited to 1.5 and 3.0 Tesla.

Moreover, it is contemplated that the non-phase-encoded MR reference data can be acquired with a multiple channel phased array coil and phase correction coefficients be determined for each channel. These phase correction coefficients are then applied to the same channel during image reconstruction of the phase-encoded data. Additionally, it is contemplated that phase correction coefficients could be determined for only one channel, and then phase correction coefficients from that channel are applied to all channels of data during image reconstruction of the phase-encoded data. In yet another embodiment, the non-phase-encoded MR reference data is acquired from one slice location and the phase correction coefficients are determined for only one slice location. In this regard, the phase correction coefficients determined from the one slice are applied to the multiple slices during image reconstruction of the phase-encoded data. In yet another embodiment, the non-phase-encoded MR reference data is acquired from multiple slice locations and the phase correction coefficients are determined for each slice location. The phase correction coefficients are then applied to the same slice location during image reconstruction of the phase-encoded data.

Therefore, an MR imaging apparatus is disclosed and includes a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR imaging apparatus also includes a computer programmed to determine phase correction coefficients from non-phase encoded data acquired in an EPI reference scan. The computer is also programmed to execute an EPI scan to acquire imaging data and, during the EPI scan, acquire non-phase encoded data. The computer then updates the phase correction coefficients from the non-phase encoded data acquired with the EPI scan and applies the updated phase correction coefficients to the imaging data during image reconstruction of the imaging data.

A method of EPI imaging is also disclosed. According to the method, image correction coefficients are determined and EPI images are acquired from a subject. The method also includes the step of determining changes in phase characteristics during the acquisition of the EPI images as well as the step of updating the phase correction coefficients based on the changes in phase characteristics.

The invention is also embodied in a computer program stored on a computer readable storage medium and having instructions which, when executed by a computer, cause the computer to establish phase correction coefficients for an EPI scan and acquire EPI data with the EPI scan. The computer is also caused to update the phase correction coefficients in real-time based on changes in phase characteristics in the EPI data during acquisition of the EPI data. The computer is further caused to apply the updated phase correction coefficients to the EPI data during image reconstruction of the EPI data.

The present invention has been described in terms of the preferred embodiment, and it is recognized that equivalents, alternatives, and modifications, aside from those expressly stated, are possible and within the scope of the appending claims.

What is claimed is:

1. A magnetic resonance (MR) imaging apparatus comprising:
   a plurality of gradient coils positioned about a bore of a magnet, and an RF transceiver system and an RF switch controlled by a pulse module to transmit RF signals to an RF coil assembly to acquire MR images; and
   a computer programmed to:
      determine phase correction coefficients from non-phase encoded data acquired during an echo planar imaging (EPI) reference scan;
      execute an EPI scan to acquire imaging data;
      during the EPI scan, acquire non-phase encoded data containing data representative of changes in gradient coil thermal characteristics
      update the phase correction coefficients from the non-phase encoded data acquired with the EPI scan; and
      apply the updated phase correction coefficients to the imaging data during image reconstruction of the imaging data to reconstruct an image that accounts for phase characteristic changes.

2. The MR imaging apparatus of claim 1 wherein the computer is further programmed to segment data acquisition during the EPI scan into a plurality of views, wherein one of the views is a baseline view, at least one view is a reference view of non-phase encoded data, and a plurality of the views are k-space views.

3. The MR imaging apparatus of claim 2 wherein the computer is further programmed to determine changes in phase characteristics during the EPI scan.

4. The MR imaging apparatus of claim 3 wherein the changes in phase characteristics are indicative of gradient coil thermal load changes during lengthy EPI scans, including Diffusion Weighted Imaging (DWI), Diffusion Tensor Imaging (DTI), and functional Magnetic Resonance Imaging (fMRI).

5. The MR imaging apparatus of claim 2 wherein the at least one reference view is a plurality of reference views that are acquired either before or after the plurality of k-space views.

6. The MR imaging apparatus of claim 1 wherein the computer is further programmed to update the phase correction coefficients in real-time.

7. The MR imaging apparatus of claim 1 wherein the computer is further programmed to update the phase correction coefficients based on non-phase encoded data acquired during steady-state conditions.

8. The MR imaging apparatus of claim 1 wherein the computer is further programmed to acquire non-phase encoded data and phase encoded data with a plurality of receive channels and update phase correction coefficients for each receive channel independently based on the respective non-phase encoded data acquired with each receive channel.

9. The MR imaging apparatus of claim 1 wherein the computer is further programmed to acquire multi-slice data during the EPI scan and determine phase correction coefficients from each slice independently.

10. The MR imaging apparatus of claim 1 wherein the computer is further programmed to acquire the imaging data with a parallel imaging technique.

11. A dynamic method of EPI phase correction in MR imaging comprising the steps of:
    conducting an EPI reference scan and determining phase correction coefficients from the EPI reference scan;
    repeatedly acquiring phase-encoded EPI image data for which images are to be generated therefrom and non-phase encoded reference data to correct phase errors therewith;
    determining changes in phase characteristics from the non-phase encoded reference data during the acquisition of the EPI images; and
    modifying the phase correction coefficients used during image reconstruction based on the changes in phase characteristics during acquisition of the EPI image data.

12. The method of claim 11 further comprising updating the phase correction coefficients in real-time during an EPI scan to acquire the EPI images.

13. The method of claim 11 applied to any one of Diffusion Weighted Imaging (DWI), Diffusion Tensor Imaging (DTI), and functional Magnetic Resonance Imaging (fMRI).

14. The method of claim 11 further comprising the steps of acquiring the non-phase encoded data in a series of reference views and acquiring the EPI images in a series of k-space views.

15. The method of claim 14 further comprising the steps of acquiring the series of reference views with the series of k-space views of a given view acquisition, either top-down or bottom-up.

16. The method of claim 11 further comprising the steps of determining respective phase correction coefficients for a plurality of receive channels and updating the respective image correction coefficients independently based on non-phase encoded data acquired with each receive channel.

17. A computer readable storage medium having instructions stored thereon that when executed by a computer causes the computer to:
    establish phase correction coefficients for an EPI scan using non-phase encoded data acquired during an EPI reference scan;
    acquire EPI data with the EPI scan;
    update the phase correction coefficients based on changes in phase characteristics in the EPI data during each of a plurality of acquisitions of the EPI data;
    reconstruct an EPI image from the plurality EPI data acquisitions with the updated phase correction coefficients to obtain an image with reduced image artifacts and reduced ghosting.

18. The computer readable storage medium of claim 17 wherein the computer is further caused to establish the phase correction coefficients from EPI reference scan data.

19. The computer readable storage medium of claim 17 wherein the change in phase characteristics of the EPI data are at least indicative of changes in gradient coil thermal characteristics during the EPI scan.

20. The computer readable storage medium of claim 17 wherein the computer is further caused to acquire the EPI data with a parallel imaging technique.

21. The computer readable storage medium of claim 20 wherein the parallel imaging technique includes one of ASSET or SENSE.

22. The computer readable storage medium of claim 17 wherein the computer is further caused to:
    establish phase correction coefficients for each slice of a multi-slice acquisition; and
    update the phase correction coefficients for each slice independently.

* * * * *